(12) United States Patent
Sun

(10) Patent No.: US 7,119,627 B2
(45) Date of Patent: Oct. 10, 2006

(54) PHASE-LOCKED LOOP CIRCUIT AS WELL AS A VOLTAGE-CONTROLLED OSCILLATOR AS USED IN A PHASE-LOCKED LOOP CIRCUIT

(75) Inventor: Yanling Sun, De Meern (NL)

(73) Assignee: Agere Systems Inc., Allentown, PA (US)

( * ) Notice: Subject to any disclaimer, the term of this patent is extended or adjusted under 35 U.S.C. 154(b) by 645 days.

(21) Appl. No.: 09/966,204

(22) Filed: Sep. 28, 2001

(65) Prior Publication Data

US 2002/0044023 A1  Apr. 18, 2002

(30) Foreign Application Priority Data

Sep. 29, 2000 (EP) .............................. 00308559

(51) Int. Cl.
*H03B 5/00* (2006.01)

(52) U.S. Cl. ..................... 331/117 R; 331/366; 331/114

(58) Field of Classification Search ............. 331/117 R, 331/56, 36 C, 167, 36 R, 114, 100, 102, 34
See application file for complete search history.

(56) References Cited

U.S. PATENT DOCUMENTS

| | | | |
|---|---|---|---|
| 4,810,976 A | | 3/1989 | Cowley et al. ............. 331/117 |
| 5,650,754 A | * | 7/1997 | Joshi et al. ................ 331/36 C |
| 6,268,778 B1 | * | 7/2001 | Mucke et al. ............ 331/117 R |
| 6,326,854 B1 | * | 12/2001 | Nicholls et al. .............. 331/56 |
| 6,327,463 B1 | * | 12/2001 | Welland ...................... 455/260 |

FOREIGN PATENT DOCUMENTS

| | | | |
|---|---|---|---|
| EP | 1005151 | | 5/2000 |
| GB | 2 361 122 A | * | 10/2001 |

OTHER PUBLICATIONS

Hiroyuki Yabuki et al., "An Experimental Study On Frequency Synthesizers Using Push–Push Oscillators", 2334c IEICE Transactions on Electronics E76–C (1993) Jun., No. 6, Tokyo, JP, pp. 932–937.

Hiroyuki Yabuki et al., "An Experimental Study On Frequency Synthesizers Using Push–Push Oscillators", 2334c IEICE Transations on Transations on Electronics E76–C (1993) Jun. No. 6, Tokyo, JP, pp. 932–937.

* cited by examiner

*Primary Examiner*—Brian Young
*Assistant Examiner*—John B Nguyen

(57) ABSTRACT

A phase-locked loop circuit comprises a voltage-controlled oscillator with at least one resonator circuit for driving the oscillator to an output frequency which is a multiple of the resonator frequency. The voltage-controlled oscillator is connected to a phase-locked loop comprising frequency control means for controlling the output frequency of the oscillator. According to the invention the resonator circuit comprises at least one adjustable component and the frequency control means are coupled into the resonator circuit for controlling the resonator frequency of the resonator circuit. The invention moreover relates to a voltage-controlled oscillator as used in this phase-locked loop circuit.

9 Claims, 1 Drawing Sheet

PHASE-LOCKED LOOP CIRCUIT AS WELL AS A VOLTAGE-CONTROLLED OSCILLATOR AS USED IN A PHASE-LOCKED LOOP CIRCUIT

CROSS-REFERENCE TO RELATED APPLICATION

This application claims priority of European Patent Application No. 00308559.4, which was filed on Sep. 29, 2000.

BACKGROUND OF THE INVENTION

The advent of wireless communications at C-band frequencies has fueled a demand for low cost high performance integrated circuits. $GH_z$ radio front ends are designed in order to meet the needs of the third generation wireless access systems in terms of bit rate and implementation constraints (size, power consumption, and cost). For this purpose, fully integrated transceivers are a common interest nowadays. Such a transceiver chip is generally coupled to a local oscillator (LO) which provides a clock for data transmission and reception. Generally, the oscillator is thereby connected in a phase-locked loop (PLL) circuit having a phase-locked loop with frequency control means to confine the output phase and frequency of the oscillator within acceptable boundaries.

Often the oscillator is formed out of a number of distributed microwave components, for instance micro strip lines, which are designed to acquire the desired electronic behaviour and characteristics. Depending on their shape and dimensions such distributed components may act either as an inductor, capacitor, resistor or conductor for the supplied signal and they are formed to render the appropriate function within the circuit. These components, however, are difficult to be integrated together with a radio-frequency (RF) system or a PLL-circuit, due to their dimension at microwave frequency. Hence, these components will usually require additional packages and external interconnections. Moreover, these distributed components are generally poorly tunable, as their electrical characteristics strongly depend on the signal frequency.

European patent application 689.287 discloses the basis setup of a more integrated approach of a phase-locked loop circuit with a voltage-controlled oscillator connected to a phase-locked loop. The PLL-circuit comprises frequency control means in the form of a phase detector which is coupled to the output of the voltage-controlled oscillator, while being fed by a reference signal. The differential signal of the phase detector is fed back to the voltage-controlled oscillator via a charge pump and a loop filter to correct any deviation from the intended output frequency. A voltage-controlled oscillator, as used in this prior art circuit, has the advantage that the output frequency can be adjusted to certain extent by means of the voltage supplied to the oscillator, which renders the device suitable for different operating speeds according to different industrial standards.

Although voltage-controlled oscillator can be designed to operate at very high speed, the phase-locked loops which are commercially available mostly cannot handle the high oscillator frequencies required in the next generation wireless communication systems of well beyond 20 $GH_z$. A known solution to this problem is down converting the fundamental oscillator frequency to a level the phase-locked loop can cope with. Another approach is to operate the voltage-controlled oscillator at a lever suitable for the phase-locked loop and up-converting the oscillator frequency to a level required by the RF system according to industrial standards. Both solutions, however, require additional circuit complexity, more packages and more circuit components, e.g. a frequency divider or frequency multiplier, and hence extra chip area, more power consumption together with vulnerable interconnections. Moreover more design uncertainty and frequency noise will be introduced by these additional circuits.

It is an object of the present invention to provide a phase-locked loop and a voltage-controlled oscillator of the kind referred to in the opening paragraph which meet the above drawbacks at least to a significant extent.

SUMMARY OF THE INVENTION

To this end, the present invention relates to a phase-locked loop circuit comprising a voltage-controlled oscillator which comprises at least one resonator circuit for driving the oscillator and a phase-locked loop comprising frequency control means for controlling the output frequency of said oscillator, whereby during operation said resonator circuit runs at a resonator frequency to drive said oscillator at an oscillator output frequency which is an even integer multiple of the resonator frequency. The invention moreover relates to a voltage-controlled oscillator as used in this phase-locked loop circuit.

The above-described phase-locked loop is characterized in that the resonator frequency is coupled to the frequency control means of the phase-locked loop, in that the resonator circuit comprises at least one adjustable component to control the resonator frequency and in that the phase-locked loop frequency control means are coupled to the resonator circuit for controlling the resonator frequency. A RF frequency needed by a RF system may be generated at one or more fundamental virtual ground nodes of the oscillator circuit and coupled with or without a high-pass filter to the RF system. The resonator circuit, however, runs at a frequency which is only an integer division (1/N, N=2n, n=1.2.3 . . . ) of said RF frequency generated by the oscillator. The reduced frequency resonator signal may be derived from one or more fundamental non-virtual ground nodes in the oscillator to be fed to the phase-locked loop. Accordingly, the phase-locked loop used in the circuit according to the invention only need to handle 1/N the RF-frequency while it controls the full output RF frequency of the oscillator. No additional frequency divider or multiplier is hence necessary to boost the applicability of a standard phase-locked loop to a higher frequency level than it can handle directly.

A specific embodiment of the phase-locked-loop circuit according to the invention is characterized in that the voltage-controlled oscillator comprises a push-push circuit whose operating frequency is determined by a pair of resonator circuits and in that the frequency control means are coupled into at least one of said pair of resonator circuits. A push-push circuit is a balanced circuit in which two active devices oscillate at the fundamental frequency 180° out of phase and in which even harmonic signals are generated in phase. In a proper operation of such a push-push circuit, power is coupled to a load only at even harmonic frequencies, while the fundamental signals cancel. Accordingly, the oscillator output signal frequency is an even multiple of that of the resonator circuits. A single-ended even-harmonic output signal of the oscillator may be fed into a RF system, such as a transceiver, while a differential fundamental output signal of the resonator circuits may be supplied to the phase-locked loop for frequency control, in accordance with the present invention, to stabilize the full oscillator output frequency.

In a more particular embodiment, the phase-locked loop circuit according to the invention is characterized in that the push-push circuit comprises a pair of substantially identical active devices being coupled to said resonator circuits, and in that an output signal which is fed back to the resonator circuits to control said active devices.

A preferred embodiment of the phase-locked loop circuit according to the invention is characterized in that the active devices are transistors, more particularly field effect transistors, and in that any other circuit components of said push-push circuit and said resonator circuits are designed to fit in the manufacturing process of said transistors. These other components generally merely consist of passive devices such as capacitors, inductors and resistors. By designing these components to fit in the same manufacturing process as that of the transistors, the entire circuit may be integrated in a single, common semiconductor body, leading to a substantial cost reduction.

A further embodiment of the phase-locked loop circuit according to the invention is characterized in that the resonator circuits comprise LC-circuits with at least one variable capacitor or varicap in said LC-circuits being controlled by the frequency control means. Such a LC-circuit can relatively easily be designed to offer the required resonator frequency, which is then doubled (N=2) by the push-push circuit. The varicap not only presents a means of varying the circuits output frequency over several frequency bands to suit a particular application, but moreover may be coupled to the frequency control means to correct any deviation from the intended output frequency. A more particular embodiment is thereby characterized in that the LC-circuits comprise at least two variable capacitors each to expand the variation of the output frequency over even a wider range.

For wideband oscillators another requirement is to keep a constant loop gain over the whole frequency range. For this purpose a further preferred embodiment of the phase-locked loop circuit according to the invention is characterized in that the active devices are each coupled in series with an inductor. Instead of being connected directly to a power supply, the active devices are each connected in series with an inductor. The inherent property of higher Q at higher frequencies of these inductors compensates a down slipping-loop gain at the higher end of a frequency band. These inductors are separate from the resonator circuits. The requirements of an absolute high Q for these devices is hence not critical.

To counteract frequency noise on the oscillator output signal, a further preferred embodiment of the voltage-controlled oscillator according to the invention is characterized in that the resonator circuits are connected to a fixed potential via a load resistor. Said load suppresses even modes between the pair of resonator circuits as only even mode will present a voltage drop over the resistor. Even mode currents may hence effectively be drained away be said load resistor.

A further preferred embodiment of the voltage-controlled oscillator and phase-locked loop circuit according to the invention is characterized in that at least the voltage-controlled oscillator merely comprises integrated components being integrated in a single semiconductor body. As far as these components are concerned no additional packages and external interconnection are required, which considerably saves manufacturing cost and adds reliability.

BRIEF DESCRIPTION OF THE DRAWINGS

The invention will be described in greater detail hereinafter, by way of example only, with reference to the accompanying drawing in which.

DETAILED DESCRIPTION

Figure 1:
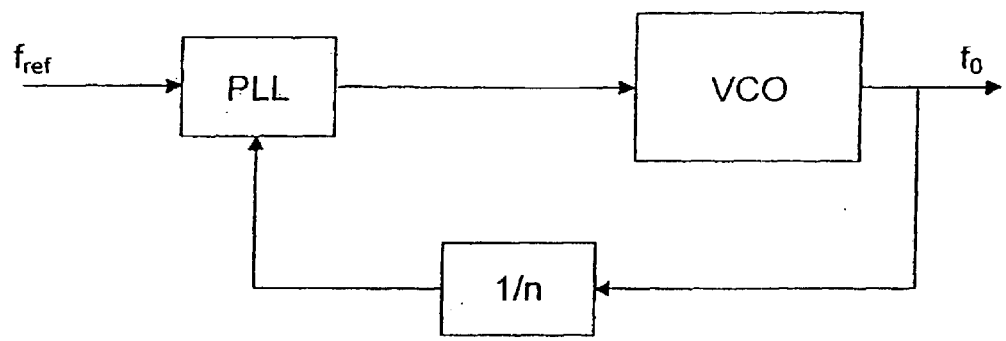
FIG. 1 shows the basic setup of a prior art phase-locked loop circuit with a voltage-controlled oscillator.

A basic block diagram for a typical phase-locked loop circuit containing a voltage-controlled oscillator according to the prior art is shown in FIG. 1. An input reference signal with a frequency $f_{ref}$ is compared by a phase detector inside the phase-locked loop PLL with the output signal of the voltage-controlled oscillator VCO having a single output frequency $f_0$. Based upon this comparison, the phase detector produces an output signal which is fed to the voltage-controlled oscillator VCO to re-adjust, if necessary, the operating frequency of the oscillator VCO in order to counteract any frequency drift which may occur at the output of the oscillator VCO during operation.

If this operating frequency $f_0$ is too high for a commercially available phase-locked loop, a frequency divider 1/n is connected between the output of the voltage-controlled oscillator VCO and the phase-locked loop PLL, as shown in FIG. 1, in order to reduce the required operating frequency of the phase-locked loop PLL by a factor n. Another prior art approach for the same problem is to generate a low frequency with the voltage-controlled oscillator which can still be handled directly by the phase-locked loop and to multiply the low oscillator output frequency by a factor n before it is fed to a RF system.

A disadvantage of both these prior art solutions to extent the applicability of a commercially available phase-locked loop to high speeds is that a separate unit is required to divide or multiply the operating frequency $f_0$ of the oscillator in order to enable an available phase-locked loop to control the output frequency. This does not only add to the complexity of the total circuit but could even mean the separate distributed components need to be used which considerably add to the total cost of the circuit.

Figure 2:
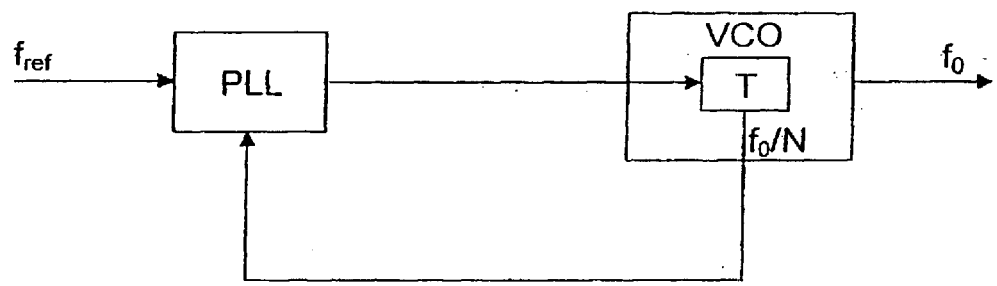
FIG. 2 shows the basic setup of a specific embodiment of a phase-locked loop circuit in accordance with the present invention.

FIG. 2 gives an example of a basic setup of a phase-locked loop circuit and voltage-controlled oscillator according to the invention which obviates this drawback, at least to a considerable extent. In this case, an input signal for the phase-locked loop PLL is taken from a resonator circuit T within the voltage-controlled oscillator VCO instead of at its output. The phase-locked loop PLL directly controls the operating frequency $f_0/N$ of said resonator circuit T which is an even division (N) of the output frequency $f_0$ of the oscillator. Because the operating frequency $f_0$ of the oscillator is directly determined by the resonator frequency $f_0/N$, the voltage-controlled oscillator is effectively controlled in this manner by a phase-locked loop, which only needs to run at the reduced resonator frequency $f_0/N$. The voltage-controlled oscillator according to the invention hence inherently generates two frequencies, a high RF output frequency for a RF system and a low internal frequency which is 1/N of the RF output frequency which can be used by the phase-locked loop or any other frequency control means for frequency control.

Figure 3:
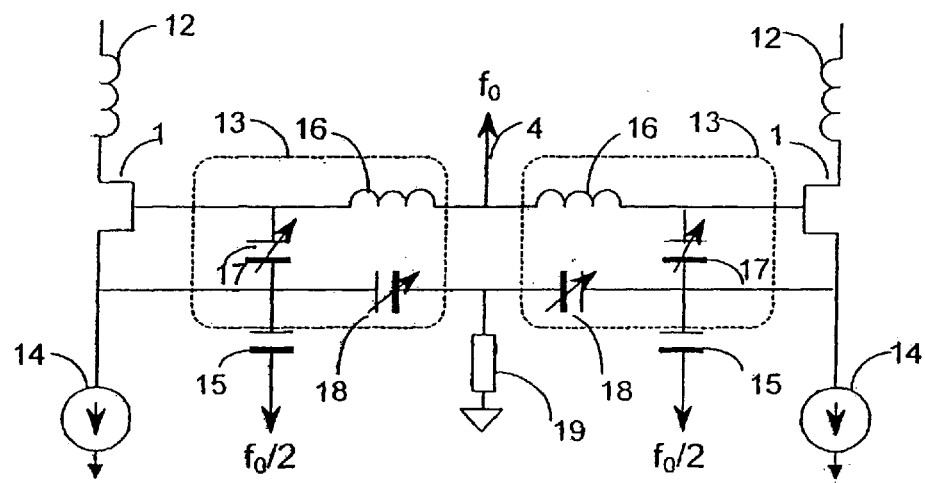
FIG. 3 shows a circuit design of a specific embodiment of a voltage-controlled oscillator in accordance with the invention, as used in FIG. 2.

A circuit design of a phase-locked loop circuit embodying the invention is given in FIG. 3. The circuits contains a voltage-controlled oscillator with a push-push topology. This is a balanced circuit containing two at least substantially identical and symmetrically arranged circuit structures, each comprising an active device 1 which, in this example, consists of a field effect transistor (FET). The active devices 1 are provided with constant current by a current source 14. The active transistors 1 are driven by two identical resonator circuits or tanks 13 which operate at fundamental frequency $f_0/2$. Second harmonic signals at $f_0$ are generated in phase at a fundamental virtual grounder node (4), which doubles the frequency range and introduces a high loadable quality factor Q. This improves the load pulling performance and phase noise.

In stead of coupling a phase-locked loop or any other frequency control means to the output 4 of the oscillator, a signal for these means is taken directly from a differential node pair 15 of both resonator circuits 13 at fundamental signal $f_0/2$, which simplifies the front-end system architecture, avoids the need for an additional frequency divider and reduces current consumption as well as chip size.

For wideband oscillators another requirement is to keep a constant loop gain over the whole frequency range. For this purpose the drain of the transistors 1 is connected via an inductor 12 instead of directly to the power supply. The inherent property of higher Q at higher frequencies of these inductors 12 compensates a down-slipping loop gain at the higher end of a frequency band. These inductors 12 are apart from the tanks 13, therefore the requirement of their absolute high Q is not critical.

Both tanks 13 comprise a substantially identical LC-circuit that operates at the fundamental frequency $f_0/2$. These LC-circuits comprise an inductor 16 together with a variable capacitor 18. These varicaps 18 may not only be used as frequency correction means to which the fundamental output signal may be fed, but moreover enable tuning of the device over different frequency bands. In this example, extra capacitive feedback between the source and gate of the transistors 1 is introduced by using two extra variable capacitors 1 to realize multi-band operation without substantially adding to the complexity or cost of the total circuit.

Even mode suppression is realized by a load resistor 19, which connects the resonator circuits to a fixed potential and provides also a DC feed of the variable capacitors 13. Different to odd modes, even modes will give rise to a net potential over the load resistor 19 and hence will drain away. Even mode oscillations at the fundamental frequency are accordingly effectively cancelled.

All components used in the circuit of FIG. 3 are designed to fit in an existing GaAs manufacturing process in order to be integrated in one and the same, common semiconductor body. This greatly reduces the total cost of the circuit. Moreover, by using merely lumped components for the oscillator and resonator circuits, the circuit can be applied at different frequency band without substantial performance degradation which would occur if micro strip like distributed components were used.

Although the invention has been described with reference to merely the foregoing embodiment, it will be appreciated that the invention is by no means limited to the embodiment given. A skilled person, on the contrary, will be able to arrive at numerous other embodiments and variations without departing from the scope and spirit of the present invention. As such he may avail himself of different kinds of push-push and resonator circuits or even base the oscillator circuit design on a different topology. Instead of using field effect transistors, bipolar transistors might as well be used as active devices in such a structure. In stead of using a phase-locked loop as frequency control means, other means could be used to control and correct the output frequency of the oscillator. In line with the present invention these means are also fed with a signal taken from the resonator circuits which drive the oscillator, such that the frequency control means can be operated at a moderate operating speed being 1/N the output RF frequency of the oscillator, where N is an even integer.

What is claimed:

1. Phase-locked loop circuit comprising:

a voltage-controlled oscillator which includes at least one resonator circuit for driving the oscillator;

a phase-locked loop including frequency control means for controlling the output frequency of said oscillator, such that during operation said resonator circuit runs at a resonator frequency to drive said oscillator at an oscillator output frequency which is an integer multiple greater than one of the resonator frequency;

wherein the resonator frequency is coupled to the frequency control means of the phase-locked loop, and wherein the resonator circuit includes at least one adjustable component to control the resonator frequency.

2. Phase-locked loop circuit according to claim 1, wherein the voltage-controlled oscillator comprises a push-pull circuit whose operating frequency is determined by a pair of resonator circuits and in that the frequency control means are coupled into at least one of said pair of resonator circuits.

3. Phase-locked loop circuit according to claim 2, wherein the push-pull circuit comprises a pair of substantially identical active devices being coupled to said resonator circuits, and in that the frequency control means comprise a phase detector which is capable of generating an output signal which is fed back t the resonator circuits to control said active devices.

4. Phase-locked loop circuit according to claim 3, wherein the active devices are field effect transistors.

5. Phase-locked loop circuit according to claim 3, wherein the resonator circuits comprise LC-circuits with at least one variable capacitor in said LC-circuits being controlled by the frequency control means.

6. Phase-locked loop circuit according to claim 5, wherein the LC-circuits comprise at least two variable capacitors each.

7. Phase-locked loop circuit according to claim 3, wherein the active devices are each coupled in series with an inductor.

8. Phase-locked loop circuit according to claim 2, wherein the resonator circuits are connected to a fixed potential via a load resistor.

9. Phase-locked loop circuit according to claim 1, wherein the voltage-controlled oscillator comprises integrated components being integrated in a single semiconductor body.

* * * * *